(12) United States Patent
Shim et al.

(10) Patent No.: US 7,327,025 B2
(45) Date of Patent: Feb. 5, 2008

(54) HEAT SPREADER FOR THERMALLY ENHANCED SEMICONDUCTOR PACKAGE

(75) Inventors: Il Kwon Shim, Singapore (SG); Sheila Marie L. Alvarez, Singapore (SG); Virgil Cotoco Ararao, Singapore (SG)

(73) Assignee: St Assembly Test Services Ltd., Singapore (SG)

( * ) Notice: Subject to any disclaimer, the term of this patent is extended or adjusted under 35 U.S.C. 154(b) by 473 days.

(21) Appl. No.: 10/836,916

(22) Filed: Apr. 30, 2004

(65) Prior Publication Data

US 2005/0242428 A1 Nov. 3, 2005

(51) Int. Cl.
*H01L 23/10* (2006.01)
*H01L 23/34* (2006.01)

(52) U.S. Cl. .................. 257/707; 257/706; 257/712

(58) Field of Classification Search ........ 257/706–707, 257/712–713, 718–720, 724
See application file for complete search history.

(56) References Cited

U.S. PATENT DOCUMENTS

| | | | |
|---|---|---|---|
| 4,849,856 A * | 7/1989 | Funari et al. .............. 361/719 |
| 6,118,177 A | 9/2000 | Lischner et al. | |
| 6,376,907 B1 | 4/2002 | Takano et al. | |
| 6,410,988 B1 | 6/2002 | Caletka et al. | |
| 6,413,353 B2 | 7/2002 | Pompeo et al. | |
| 6,469,381 B1 * | 10/2002 | Houle et al. ............... 257/707 |
| 6,541,310 B1 * | 4/2003 | Lo et al. .................... 438/122 |
| 6,562,655 B1 | 5/2003 | Glenn | |
| 6,580,167 B1 * | 6/2003 | Glenn et al. ............... 257/718 |
| 2003/0034569 A1 | 2/2003 | Caletka et al. | |
| 2003/0131975 A1 | 7/2003 | Houle et al. | |
| 2003/0189219 A1 | 10/2003 | Houle et al. | |

* cited by examiner

*Primary Examiner*—Ori Nadav
(74) *Attorney, Agent, or Firm*—Mikio Ishimaru

(57) ABSTRACT

An electronic device having a substrate carrier is provided. A semiconductor connected to the substrate carrier. A heat spreader having upper and lower surfaces and legs recessed below the lower surface is connected to the substrate carrier. The Z-dimension between the heat spreader and the substrate carrier is maintained over substantially the entire area of the substrate carrier.

19 Claims, 13 Drawing Sheets

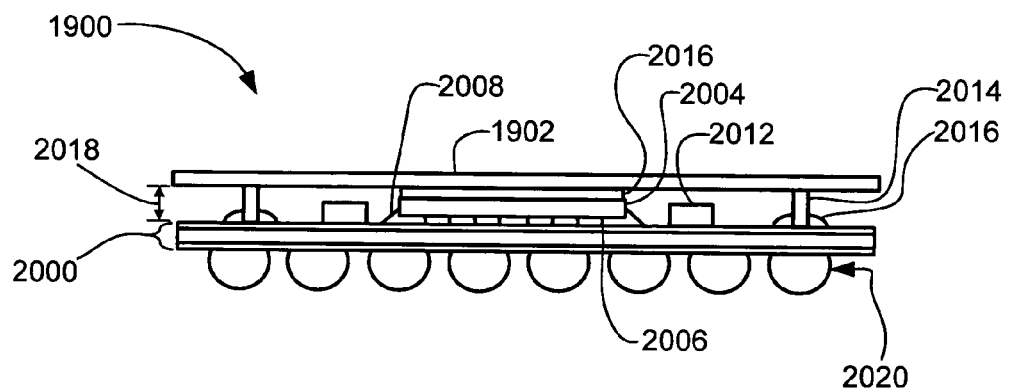
FIG. 22
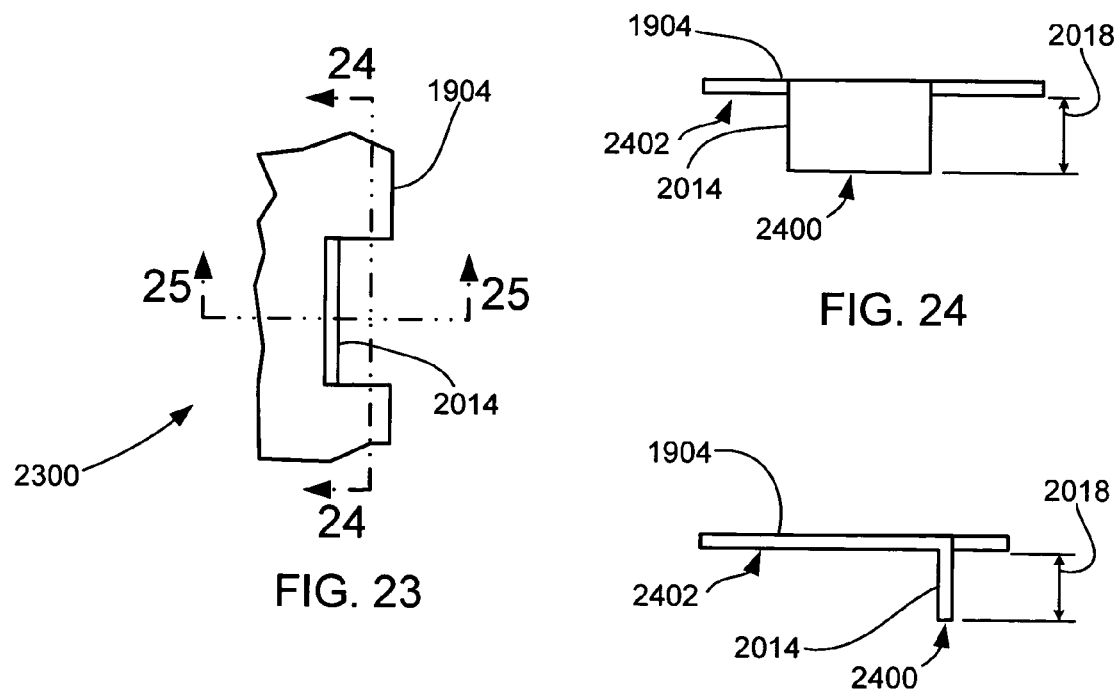
FIG. 23
FIG. 24
FIG. 25

HEAT SPREADER FOR THERMALLY ENHANCED SEMICONDUCTOR PACKAGE

TECHNICAL FIELD

The present invention relates generally to semiconductors, and more particularly to a method and apparatus for providing a heat spreader for thermally enhanced semiconductor packages.

BACKGROUND ART

Recently, there has been rapid development in semiconductor technology and, as a result, semiconductors are becoming smaller, circuitry within semiconductors is becoming increasingly dense to provide higher speeds. As the density increases however, higher power is used in these semiconductor components. Additionally, there is a trend toward combining multiple semiconductors in a single package to form a system-in-a-package or a multi-chip module. As the circuit density increases and multiple semiconductors are placed in one package, heat generation typically increases as well. Thus, heat dissipation is becoming more critical as semiconductor technology develops to address the increasing demand for semiconductors having higher power and speed.

Various techniques may be used to remove or dissipate heat generated by a semiconductor. One such technique involves the use of a mass of conductive material in thermal contact with the semiconductor. The mass of conductive material typically is referred to as a heat spreader. One of the primary purposes of a heat spreader is to absorb and dissipate the heat generated by the electronic circuitry on the semiconductor and to spread the heat away from the semiconductor. The heat spreader thereby removes the heat from the semiconductor and reduces the likelihood of the occurrence of hot spots that can have an adverse effect on the performance and reliability of the semiconductor.

Heat spreaders are made of a thermally conductive material such as aluminum, electro-plated copper, copper alloy, or ceramic, for example. A heat spreader is positioned in thermal contact with a semiconductor by use of a thermally conductive material, such as thermally conductive gels, greases, or solders, as well as to provide thermal conductivity between the semiconductor and the heat spreader.

An electronic device may comprise at least one semiconductor coupled to a heat spreader and a substrate carrier. Passive electronic components such as capacitors also may be attached to the substrate carrier. Typically, the semiconductor is attached to one side of the substrate carrier by means of a number of solder balls, solder bumps, or other alternative connections. The heat spreader may be formed out of a suitable thermally conductive material such as copper, aluminum, carbon composites, or alternative suitable materials. The heat spreader is typically positioned in thermal contact with the semiconductor by means of a thermal adhesive.

Some heat spreaders have a lip around all, or a portion, of the body of the heat spreader. The lip is used to attach the heat spreader to the substrate and to provide structural leg support for the body of the heat spreader around the semiconductor. However, the lip does not contribute significantly to heat dissipation, and may add weight and cost to an electronic device. The lip also occupies space on the substrate that otherwise could be used for placement of additional passive components or semiconductors.

Other heat spreaders have a number of legs that support the body of the heat spreader a distance above the substrate carrier. The distance between the upper surface of the substrate carrier and the lower surface of the body of the heat spreader is referred to herein as the Z-dimension. However, the legs of these heat spreaders utilize substantial portions of the surface area of the substrate carrier that otherwise could be used to carry a larger semiconductor, additional passive components, or additional semiconductors. A need exists for an improved heat spreader design, which does not utilize a significant portion of the substrate carrier for attachment of the heat spreader while maintaining the Z-dimension over the surface of the substrate carrier.

Solutions to these problems have been long sought but prior developments have not taught or suggested any solutions and, thus, solutions to these problems have long eluded those skilled in the art.

DISCLOSURE OF THE INVENTION

The present invention provides an electronic device having a substrate carrier. A semiconductor is connected to the substrate carrier. A heat spreader having upper and lower surfaces and legs recessed below the lower surface is connected to the substrate carrier. The Z-dimension between the heat spreader and the substrate carrier is maintained over substantially the entire area of the substrate carrier. This electronic device removes heat from the semiconductor and reduces the likelihood of hot spots within the semiconductor thereby increasing its reliability and performance.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 22 is a cross-sectional view of the electronic device shown in FIG. 19 taken along line 22-22;

FIG. 23 is a plan view of an alternative embodiment of a leg shown in FIG. 19;

FIG. 24 is a cross-sectional view of the leg shown in FIG. 23 taken along line 24-24;

FIG. 25 is a cross-sectional view of the leg shown in FIG. 23 taken along line 25-25;

BEST MODE FOR CARRYING OUT THE INVENTION

Figure 1:
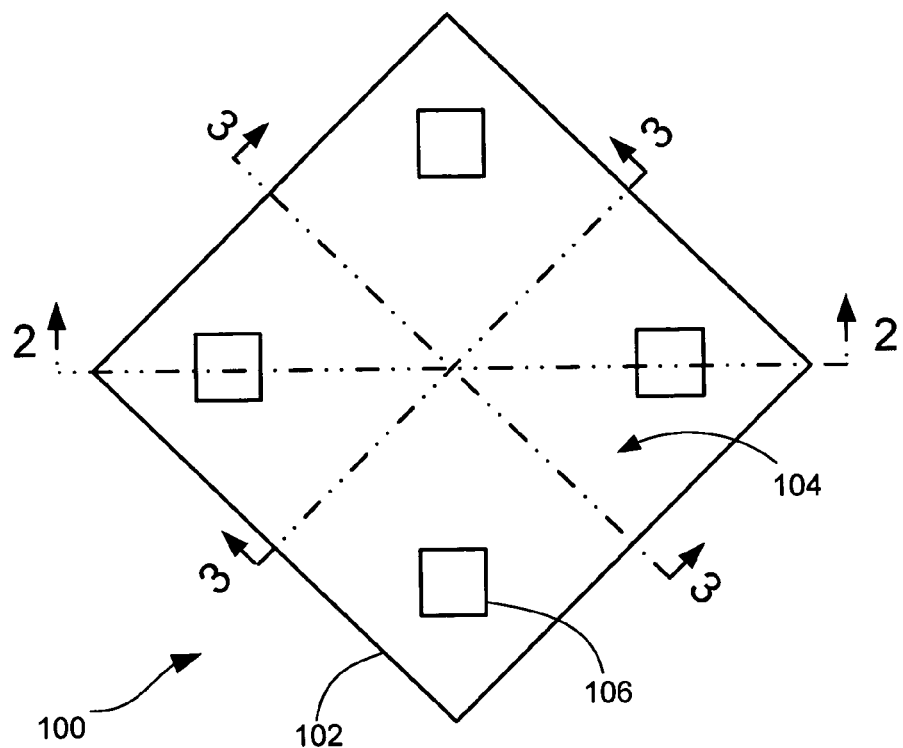
FIG. 1 is a plan view of an electronic device having a heat spreader manufactured in accordance with the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the electronic device are semi-diagrammatic and not to scale and, particularly, some of the dimensions are for the clarity of presentation and are shown exaggerated in the FIGS. In addition, where multiple embodiments are disclosed and described having some features in common, for clarity and ease of illustration and description thereof like features one to another will ordinarily be described with like reference numerals.

The term "horizontal" as used herein is defined as a plane parallel to the conventional plane or surface of the semiconductor, regardless of its orientation. The term "vertical" refers to a direction perpendicular to the horizontal as just defined. Terms, such as "on", "above", to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1 therein is shown a plan view of an electronic device 100 manufactured in accordance with an embodiment of the present invention. The electronic device 100 includes a heat spreader 102. The heat spreader 102 has a body portion 104 and a number of spaces 106 formed within the perimeter of the body portion 104 of the heat spreader 102. Each of the spaces 106 is substantially square and is formed interior to the perimeter of the body portion 104 of the heat spreader 102, such as by stamping or otherwise forming.

Figure 2:
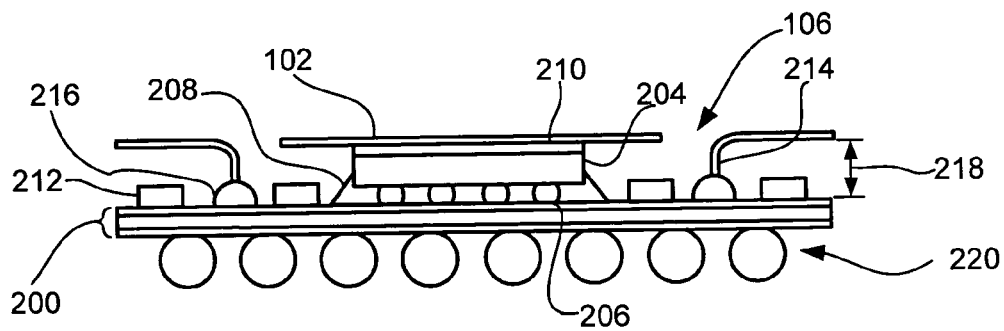
FIG. 2 is a cross-sectional view of the electronic device shown in FIG. 1 taken along line 2-2.

Referring now to FIG. 2 therein is shown a cross-sectional view of the electronic device 100 shown in FIG. 1 taken along line 2-2. The electronic device 100 has a substrate carrier 200. A semiconductor 204 is mounted on the upper surface of the substrate carrier 200. The semiconductor 204 is mounted on the substrate carrier 200 by electrically connecting the semiconductor 204 to the substrate carrier 200 using a number of electrical connections 206, such as solder balls, or solder bumps. The semiconductor 204 also is physically attached to the substrate carrier 200 using an adhesive layer 208, such as an epoxy layer.

The heat spreader 102 is attached to the upper surface of the semiconductor 204 using a thermally conductive adhesive 210. A number of passive components 212, such as capacitors, also may be mounted as necessary for a particular design on the substrate carrier 200.

The heat spreader 102 has a number of legs 214 that is attached in the present embodiment to the substrate carrier 200 using a thermally conductive adhesive 216.

The space between the upper surface of the substrate carrier 200 and the lower surface of the heat spreader 102 is referred to herein as a Z-dimension 218. The Z-dimension 218 preferably is maintained constant over the surface of the substrate carrier 200 to prevent the formation of localized hot spots in the electronic device 100 during its operation.

A number of solder balls 220 is connected to the lower surface of the substrate carrier 200 for subsequent mounting of the electronic device 100 to a printed circuit board (PCB), which is not shown.

Figure 3:
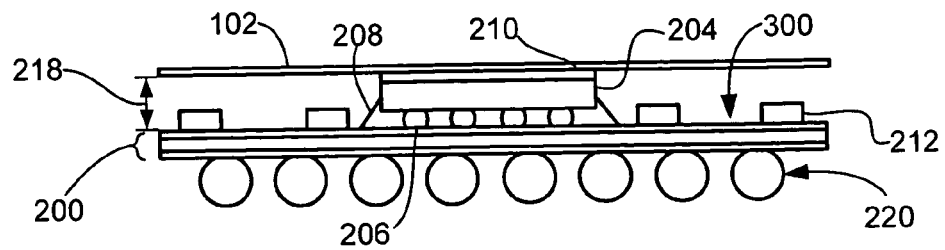
FIG. 3 is a cross-sectional view of the electronic device shown in FIG. 1 taken along line 3-3.

Referring now to FIG. 3 therein is shown a cross-sectional view of the electronic device 100 shown in FIG. 1 taken along line 3-3. The substrate carrier 200 has an upper surface 300. The heat spreader 102 covers the surface of the semiconductor 204 and preferably extends to cover substantially the entire upper surface 300 of the substrate carrier 200 thereby maximizing the heat dissipation capability of the heat spreader 102.

Figure 4:
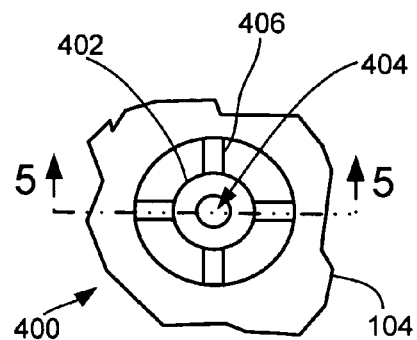
FIG. 4 is a plan view of one embodiment of a leg having a circular base with a centrally positioned hole therein.

Referring now to FIG. 4 therein is shown a plan view of an alternate embodiment of the number of legs 214 shown in FIG. 2. A leg 400 includes a circular leg base 402 having a central aperture 404 therein. The circular leg base 402 is connected to the body portion 104 by a number of leg supports 406. The leg 400 may be formed integrally with the body portion 104 by any suitable manufacturing process, such as stamping, or forming.

Figure 5:
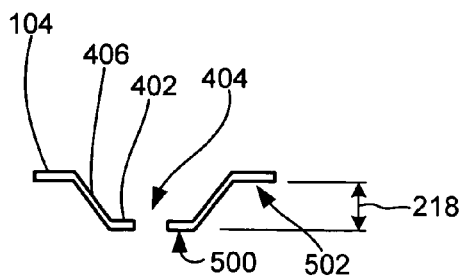
FIG. 5 is a cross-sectional view of the leg shown in FIG. 4 taken along line 5-5.

Referring now to FIG. 5 therein is shown a cross-sectional view of the leg 400 shown in FIG. 4 taken along line 5-5. The number of leg supports 406 is slanted upwardly and outwardly from the outer periphery of the circular leg base 402 to the body portion 104. The vertical distance between a lower surface 500 of the circular leg base 402 and a lower surface 502 of the body portion 104 is substantially equal to the Z-dimension 218.

Figure 6:
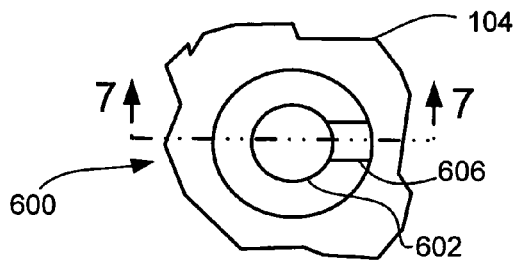
FIG. 6 is a plan view of another embodiment of a leg having a solid circular base.

Referring now to FIG. 6 therein is shown a plan view of another embodiment of the number of legs 214 shown in FIG. 2. A leg 600 includes a solid circular leg base 602. The solid circular leg base 602 is connected to the body portion 104 by a leg support 606. The leg 600 may be formed integrally with the body portion 104 by any suitable manufacturing process, such as stamping, or forming.

Figure 7:
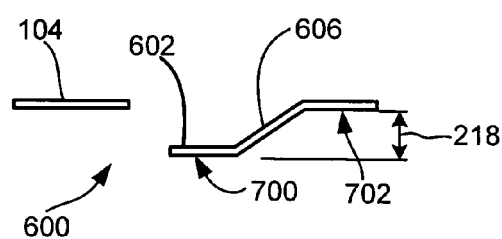
FIG. 7 is a cross-sectional view of the leg shown in FIG. 6 taken along line 7-7.

Referring now to FIG. 7 therein is shown a cross-sectional view of the leg 600 shown in FIG. 6 taken along line 7-7. The leg support 606 is slanted upwardly and outwardly from the outer periphery of the solid circular leg base 602 to the body portion 104. The vertical distance between a lower surface 700 of the solid circular leg base 602 and a lower surface 702 of the body portion 104 is substantially equal to the Z-dimension 218.

Figure 8:
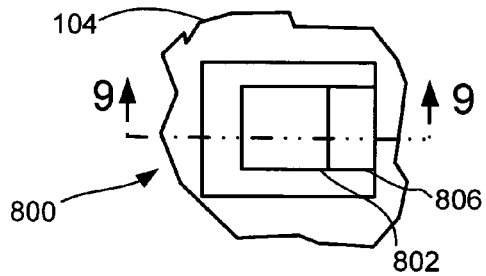
FIG. 8 is a plan view of another embodiment of a leg having a square base.

Referring now to FIG. 8 therein is shown a plan view of another embodiment of the number of legs 214 shown in FIG. 2. A leg 800 includes a square leg base 802. The square leg base 802 is connected to the body portion 104 by a leg support 806. The leg 800 may be formed integrally with the body portion 104 by any suitable manufacturing process, such as stamping, or forming.

Figure 9:
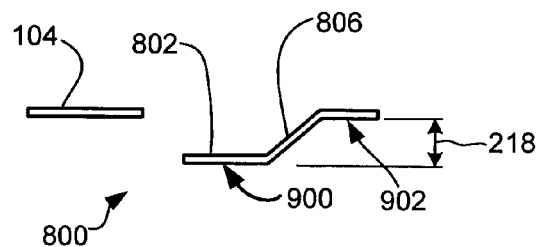
FIG. 9 is a cross-sectional view of the leg shown in FIG. 8 taken along line 9-9.

Referring now to FIG. 9 therein is shown a cross-sectional view of the leg 800 shown in FIG. 8 taken along line 9-9. The leg support 806 is slanted upwardly and outwardly from the outer periphery of the square leg base 802 to the body portion 104. The vertical distance between a lower surface 900 of the square leg base 802 and a lower surface 902 of the body portion 104 is substantially equal to the Z-dimension 218.

Figure 10:
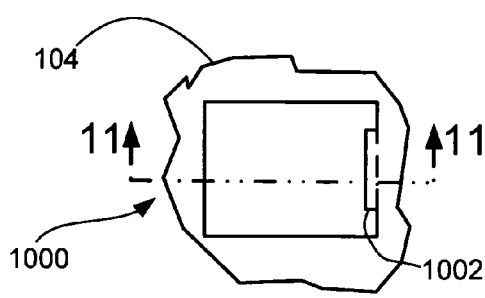
FIG. 10 is a plan view of another embodiment of a leg having a vertical tab.

Referring now to FIG. 10 therein is shown a plan view of the embodiment of the number of legs 214 shown in FIG. 2. A leg 1000 includes a leg support 1002 connected to the body portion 104. The leg 1000 may be formed integrally with the body portion 104 by any suitable manufacturing process, such as stamping, or forming.

Figure 11:
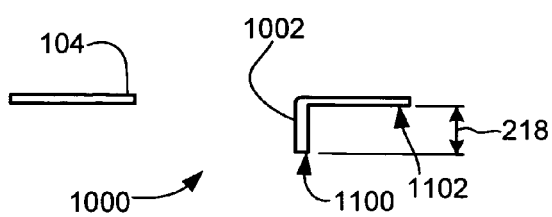
FIG. 11 is a cross-sectional view of the leg shown in FIG. 10 taken along line 11-11.

Referring now to FIG. 11 therein is shown a cross-sectional view of the leg 1000 shown in FIG. 10 taken along line 11-11. The leg support 1002 is connected to the body portion 104 of the heat spreader 102 in a substantially perpendicular relationship. The vertical distance between a lower surface 1100 of the leg support 1002 and a lower surface 1102 of the body portion 104 is substantially equal to the Z-dimension 218.

Figure 12:
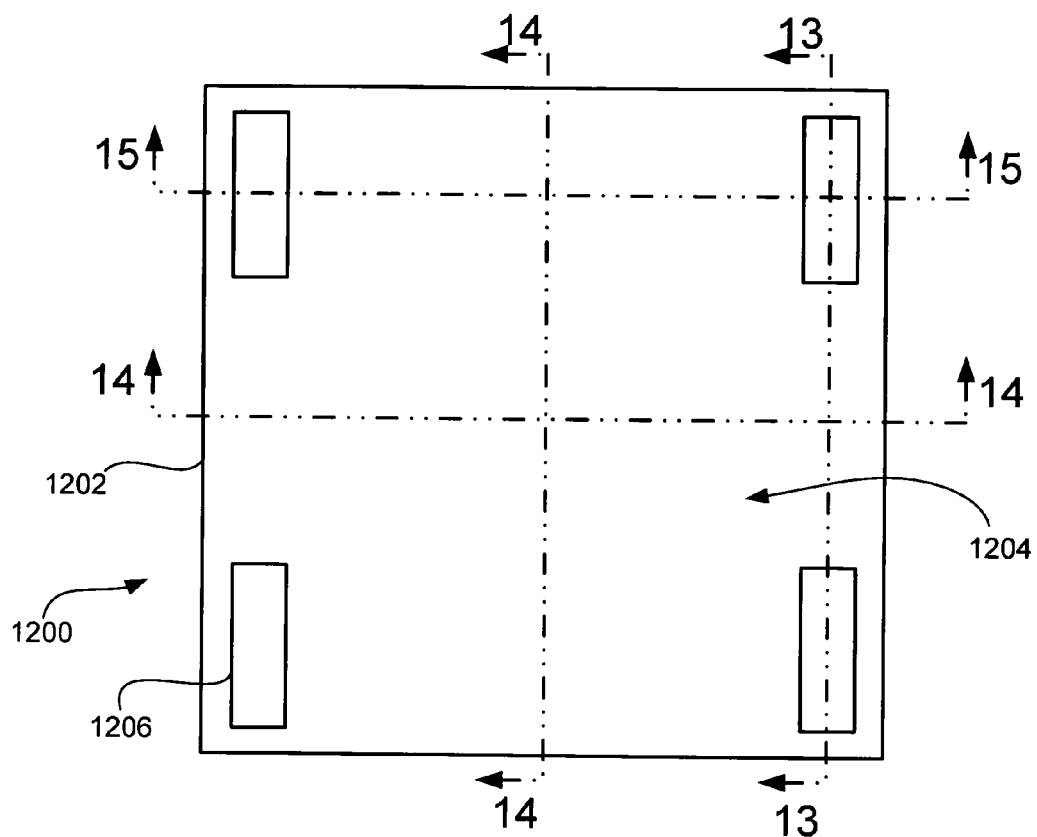
FIG. 12 is a plan view of an alternate embodiment of an electronic device manufactured in accordance with the present invention.

Referring now to FIG. 12 therein is shown a plan view of an electronic device 1200 manufactured in accordance with an alternate embodiment of the present invention. The electronic device 1200 has a heat spreader 1202. The heat spreader 1202 has a body portion 1204 and a number of spaces 1206 formed within the perimeter of the body portion 1204 of the heat spreader 1202. The number of spaces 1206 is substantially rectangular and is formed interior to the perimeter of the body portion 1204 of the heat spreader 1202, such as by stamping or otherwise forming.

Figure 13:
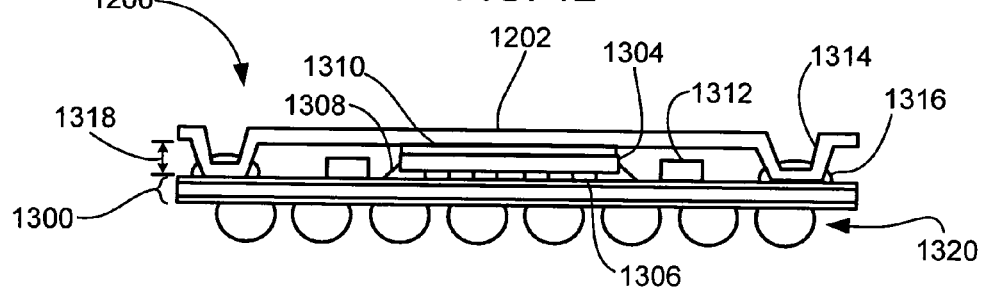
FIG. 13 is a cross-sectional view of the electronic device shown in FIG. 12 taken along line 13-13.

Referring now to FIG. 13, therein is shown a cross-sectional view of the electronic device 1200 shown in FIG. 12 taken along 13-13. The electronic device 1200 has a substrate carrier 1300. A semiconductor 1304 is mounted on the upper surface of the substrate carrier 1300. The semiconductor 1304 is mounted on the substrate carrier 1300 by electrically connecting the semiconductor 1304 to the substrate carrier 1300 using a number of electrical connections 1306, such as solder balls, or solder bumps. The semiconductor 1304 also is physically attached to the substrate carrier 1300 using an adhesive layer 1308, such as an epoxy layer.

The heat spreader 1202 is attached to the upper surface of the semiconductor 1304 using a thermally conductive adhesive 1310. A number of passive components 1312, such as capacitors, also may be mounted as necessary for a particular design on the substrate carrier 1300.

The heat spreader has a number of legs 1314 attached to the substrate carrier 1300 using a thermally conductive adhesive 1316.

The space between the upper surface of the substrate carrier 1300 and the lower surface of the heat spreader 1202 is referred to herein as a Z-dimension 1318. The Z-dimension 1318 preferably is maintained constant over the surface of the substrate carrier 1300 to prevent the formation of localized hot spots in the electronic device 1200 during its operation.

A number of solder balls 1320 is connected to the lower surface of the substrate carrier 1300 for subsequent mounting of the electronic device 1200 to a printed circuit board (PCB), which is not shown.

Figure 14:
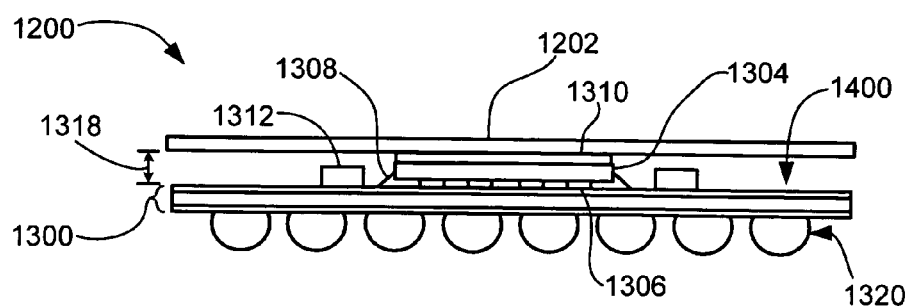
FIG. 14 is a cross-sectional view of the electronic device shown in FIG. 12 taken along line 14-14.

Referring now to FIG. 14 therein is shown a cross-sectional view of the electronic device 1200 shown in FIG. 12 taken along line 14-14. The substrate carrier 1300 has an upper surface 1400. The heat spreader 1202 covers the surface of the semiconductor 1304 and preferably extends to cover substantially the entire upper surface 1400 of the substrate carrier 1300 thereby maximizing the heat dissipation capability of the heat spreader 1202.

Figure 15:
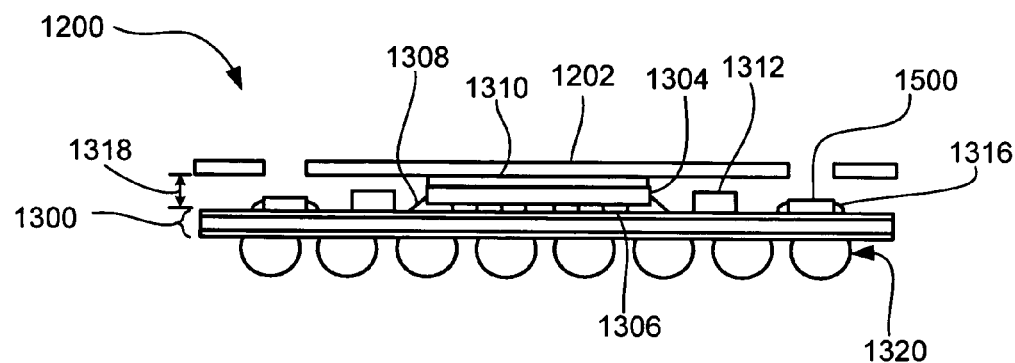
FIG. 15 is a cross-sectional view of the electronic device shown in FIG. 12 taken along line 15-15.

Referring now to FIG. 15 therein is shown a cross-sectional view of the electronic device 1200 shown in FIG. 12 taken along line 15-15. A leg base 1500 of the number of legs 1314 shown in FIG. 13 is attached to the substrate carrier 1300 using the thermally conductive adhesive 1316.

Figure 16:
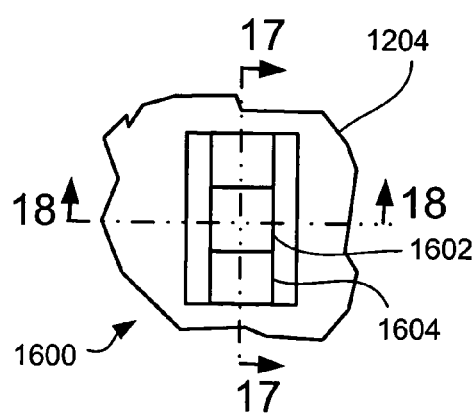
FIG. 16 is a plan view of another embodiment of a leg having a square base shown in FIG. 12.

Referring now to FIG. 16 therein is shown a plan view of one of the number of legs 1314 shown in FIG. 13. A leg 1600 includes a leg base 1602 and a number of leg supports 1604 connected between the body portion 1204 and the edge of the leg base 1602. The leg base 1602 is substantially square.

Figure 17:
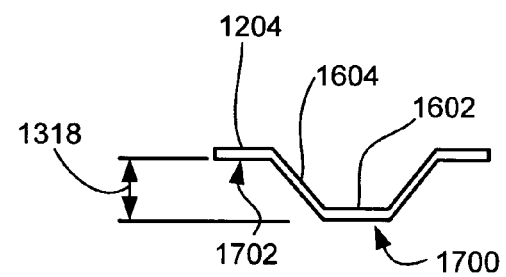
FIG. 17 is a cross-sectional view of the leg shown in FIG. 16 taken along line 17-17.

Referring now to FIG. 17 therein is shown a cross-sectional view of the leg 1600 shown in FIG. 16 taken along line 17-17. The number of leg supports 1604 is slanted upwardly and outwardly from the outer periphery of the leg base 1602 to the body portion 1204. The vertical distance between a lower surface 1700 of the leg base 1602 and a lower surface 1702 of the body portion 1204 is substantially equal to the Z-dimension 1318.

Figure 18:
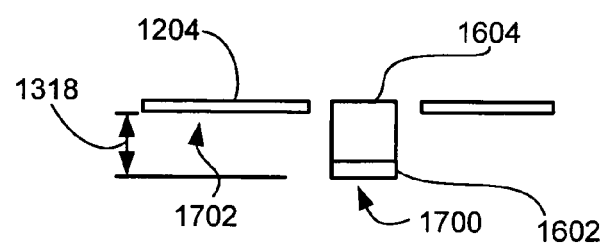
FIG. 18 is a cross-sectional view of the leg shown in FIG. 16 taken along line 18-18.

Referring now to FIG. 18 therein is shown a cross-sectional view of the leg 1600 shown in FIG. 16 taken along line 18-18. The lower surface of the leg base 1602 is spaced from the lower surface of the body portion 1204 by a distance equal to the Z-dimension 1318.

Figure 19:
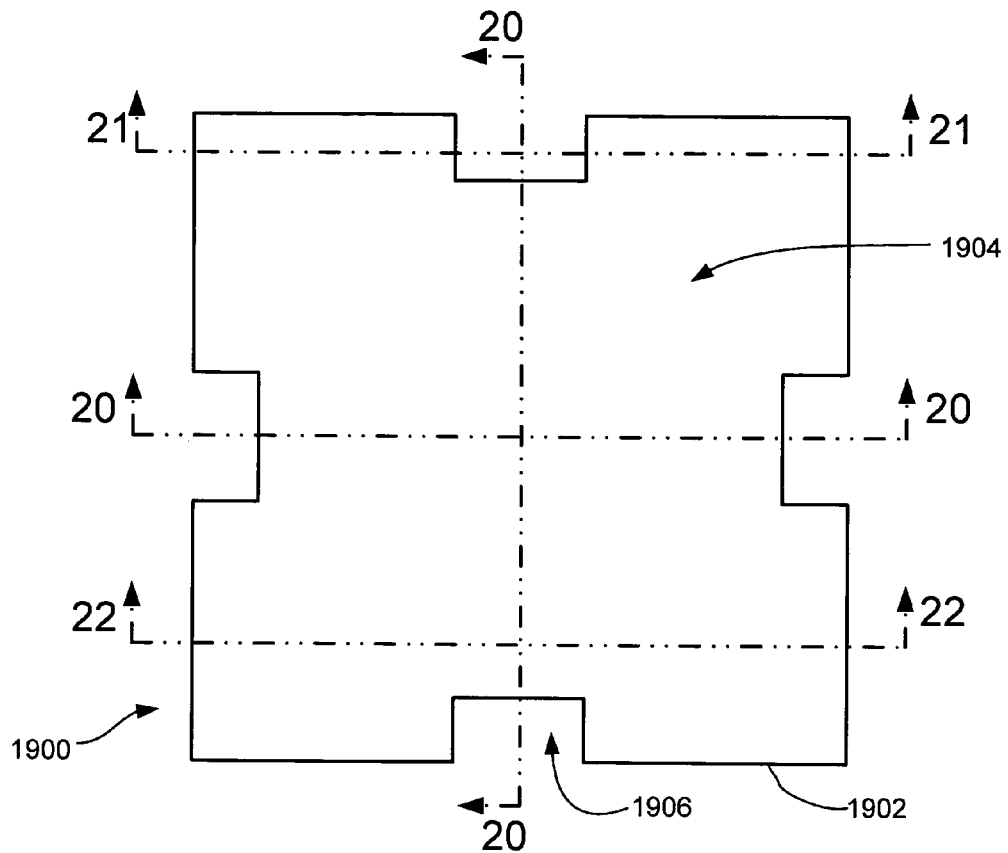
FIG. 19 is a plan view of another embodiment of an electronic device manufactured in accordance with the present invention.

Referring now to FIG. 19 therein is shown a plan view of an electronic device 1900 manufactured in accordance with another embodiment of the present invention. The electronic device 1900 includes a heat spreader 1902. The heat spreader 1902 has a body portion 1904 and a number of spaces 1906 formed within the perimeter of the body portion 1904. The number of spaces 1906 is substantially rectangular and is formed interior to the perimeter of the body portion 1904 of the heat spreader 1902, such as by stamping or otherwise forming.

Figure 20:
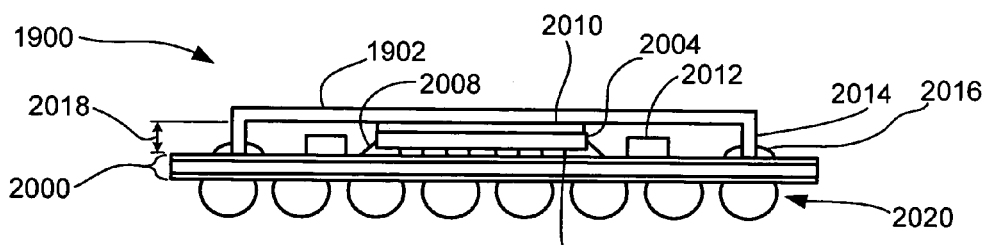
FIG. 20 is a cross-sectional view of the electronic device shown in FIG. 19 taken along line 20-20.

Referring now to FIG. 20 therein is shown a cross-sectional view of the electronic device 1900 shown in FIG. 19 taken along line 20-20. The electronic device 1900 has a substrate carrier 2000. A semiconductor 2004 is mounted on the upper surface of the substrate carrier 2000. The semiconductor 2004 is mounted on the substrate carrier 2000 by electrically connecting the semiconductor 2004 to the substrate carrier 2000 using a number of electrical connections 2006, such as solder balls, or solder bumps. The semiconductor 2004 also is physically attached to the substrate carrier 2000 using an adhesive layer 2008, such as an epoxy layer.

The heat spreader 1902 is attached to the upper surface of the semiconductor 2004 using a thermally conductive adhesive 2010. A number of passive components 2012, such as capacitors, also may be mounted as necessary for a particular design on the substrate carrier 2000.

The heat spreader 1902 has a number of legs 2014 attached to the substrate carrier 2000 using a thermally conductive adhesive 2016.

The space between the upper surface of the substrate carrier 2000 and the lower surface of the heat spreader 1902 is referred to herein as a Z-dimension 2018. The Z-dimension 2018 preferably is maintained constant over the surface of the substrate carrier 2000 to prevent the formation of localized hot spots in the electronic device 1900 during its operation. The length of the number of legs 2014 is substantially equal to the Z-dimension 2018.

A number of solder balls 2020 is connected to the lower surface of the substrate carrier 2000 for subsequent mounting of the electronic device 1900 to a printed circuit board (PCB), which is not shown.

Figure 21:
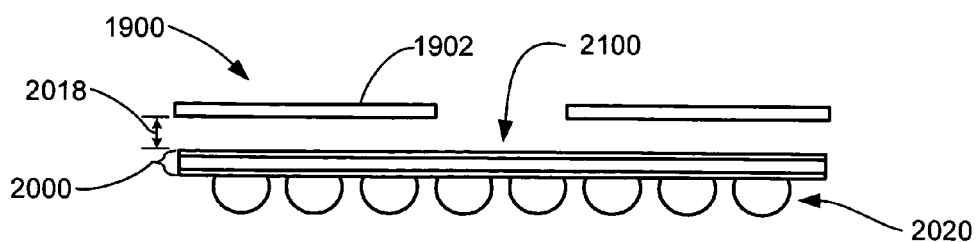
FIG. 21 is a cross-sectional view of the electronic device shown in FIG. 19 taken along line 21-21.

Referring now to FIG. 21 therein is shown a cross-sectional view of the electronic device 1900 shown in FIG. 19 taken along line 21-21. The substrate carrier 2000 has an upper surface 2100. The heat spreader 1902 preferably extends to cover substantially the entire upper surface 2100 of the substrate carrier 2000 thereby maximizing the heat dissipation capability of the heat spreader 1902.

Referring now to FIG. 22 therein is shown a cross-sectional view of the electronic device 1900 shown in FIG. 19 taken along line 22-22. The Z-dimension 2018 is maintained over the surface of the substrate carrier 2000.

Referring now to FIG. 23 therein is shown a plan view of one of the number of legs 2014 of the electronic device shown in FIG. 20. A leg 2300 may be formed integrally with the body portion 1904 by any suitable manufacturing process, such as stamping, or forming.

Referring now to FIG. 24 therein is shown a cross-sectional view of the leg 2300 shown in FIG. 23 taken along line 24-24. The leg 2300 comprises a leg support 2400 that extends downward from the body portion 1904 by a distance substantially equal to the Z-dimension 2018. The distance between a lower surface 2400 of the number of legs 2014 and a lower surface 2402 of the body portion 1904 is substantially equal to the Z-dimension 2018.

Referring now to FIG. 25 therein is shown a cross-sectional view of the leg 2300 shown in FIG. 23 taken along line 25-25. The leg 2300 is substantially perpendicular to the surface of the body portion 1904. The distance between the lower surface 2400 of the number of legs 2014 and the lower surface 2402 of the body portion 1904 is substantially equal to the Z-dimension 2018.

Figure 26:
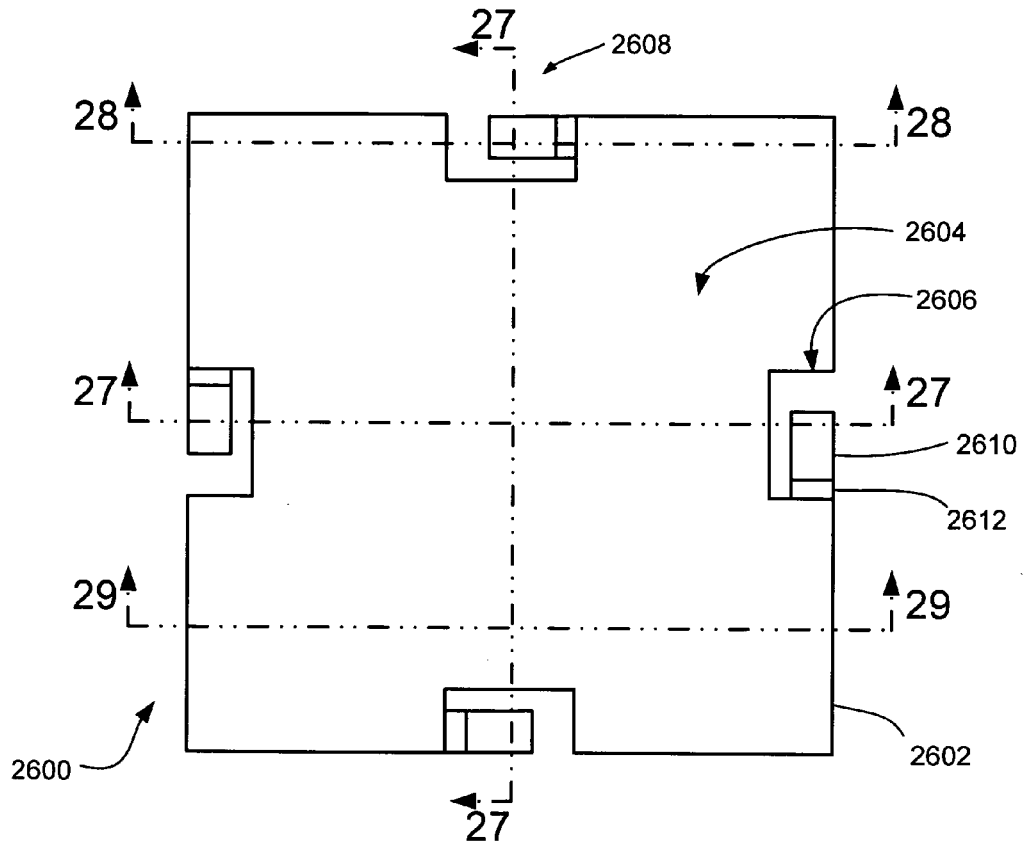
FIG. 26 is a plan view of another embodiment of an electronic device manufactured in accordance with the present invention.

Referring now to FIG. 26 therein is shown a plan view of an electronic device 2600 manufactured in accordance with another embodiment of the present invention. The electronic device 2600 includes a heat spreader 2602. The heat spreader 2602 has a body portion 2604 and a number of spaces 2606 formed within the perimeter of the body portion 2604. Each of the number of spaces 2606 is substantially rectangular and is formed, such as by stamping or otherwise forming.

Each of the number of spaces 2606 is positioned interior of the perimeter of the heat spreader 2602 and between the corners of the heat spreader 2602. Within the number of spaces 2606 is a number of legs 2608. The number of legs 2608 includes a leg base 2610 and a leg support 2612.

Figure 27:
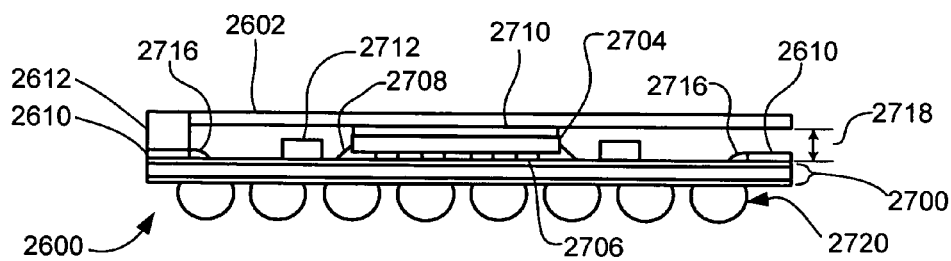
FIG. 27 is a cross-sectional view of the electronic device shown in FIG. 26 taken along line 27-27.

Referring now to FIG. 27 therein is shown a cross-sectional view of the electronic device 2600 shown in FIG. 26 taken along line 27-27. The electronic device 2600 has a substrate carrier 2700. A semiconductor 2704 is mounted on the upper surface of the substrate carrier 2700. The semiconductor 2704 is mounted on the substrate carrier 2700 by electrically connecting the semiconductor 2704 to the substrate carrier 2700 using a number of electrical connections 2706, such as solder balls, or solder bumps. The semiconductor 2704 also is physically attached to the substrate carrier 2700 using an adhesive layer 2708, such as an epoxy layer.

The heat spreader 2602 is attached to the upper surface of the semiconductor 2704 using a thermally conductive adhesive 2710. A number of passive components 2712, such as capacitors, also may be mounted as necessary for a particular design on the substrate carrier 2700.

The heat spreader 2602 has number of legs 2608 attached to the substrate carrier 2700 using a thermally conductive adhesive 2716. The leg base 2610 is positioned on the upper surface of the substrate carrier 2700. The leg support 2612 connects the leg base 2610 to the heat spreader 2602.

The space between the upper surface of the substrate carrier 2700 and the lower surface of the heat spreader 2602 is referred to herein as a Z-dimension 2718. The Z-dimension 2718 preferably is maintained constant over the surface of the substrate carrier 2700 to prevent the formation of localized hot spots in the electronic device 2600 during its operation. The length of the number of legs 2608 is substantially equal to the Z-dimension 2018.

A number of solder balls 2720 is connected to the lower surface of the substrate carrier 2700 for subsequent mounting of the electronic device 2600 to a printed circuit board (PCB), which is not shown.

Figure 28:
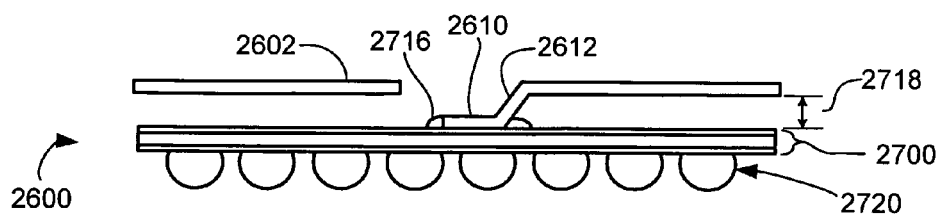
FIG. 28 is a cross-sectional view of the electronic device shown in FIG. 26 taken along line 28-28.

Referring now to FIG. 28 therein is shown a cross-sectional view of the electronic device 2600 shown in FIG. 26 taken along line 28-28. The number of legs 2608 shown in FIG. 26 includes the leg base 2610 attached to the substrate carrier 2700 using the thermally conductive adhesive 2716. The leg base 2610 is connected to the heat spreader 2602 by the leg support 2612. The leg support 2612 is slanted upwardly and outwardly from the edge of the leg base 2610 to the heat spreader 2602. A lower surface 2800 of the leg base 2610 is separated from a lower surface 2802 of the heat spreader 2602 by a distance substantially equal to the Z-dimension 2718.

Figure 29:
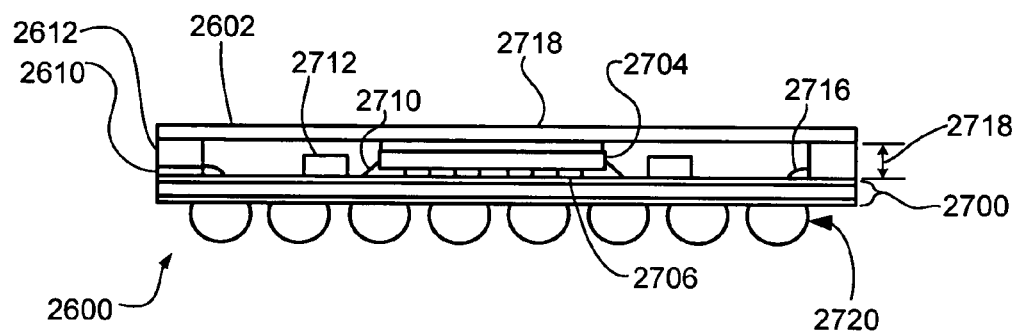
FIG. 29 is a cross-sectional view of the electronic device shown in FIG. 26 taken along line 29-29.

Referring now to FIG. 29 therein is shown a cross-sectional view of the electronic device 2600 shown in FIG. 26 taken along line 29-29. The heat spreader 2602 is positioned from the substrate carrier 2700 by the Z-dimension 2718 across substantially the entire surface of the substrate carrier 2700.

Figure 30:
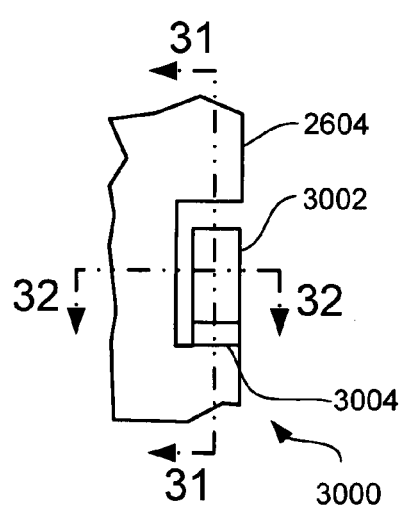
FIG. 30 is a plan view of another embodiment of a leg having a rectangular base.

Referring now to FIG. 30 therein is shown an enlarged plan view of an alternate embodiment of the number of legs 2608 of the electronic device 2600 shown in FIG. 26. A leg 3000 includes a rectangular leg base 3002 connected to the body portion 2604 of the heat spreader 2602 shown in FIG. 26 by a leg support 3004. The leg 3000 may be formed integrally with the body portion 2604 by any suitable manufacturing process, such as stamping, or forming.

Figure 31:
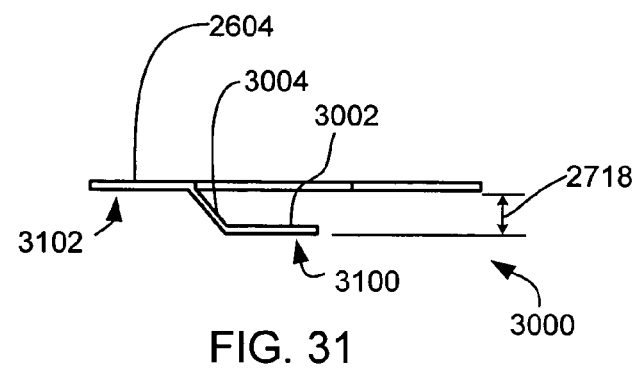
FIG. 31 is a cross-sectional view of the leg shown in FIG. 30 taken along line 31-31.

Referring now to FIG. 31 therein is shown a cross-sectional view of the leg 3000 shown in FIG. 30 taken along line 31-31. The leg support 3004 is slanted upwardly and outwardly from the outer periphery of the rectangular leg base 3002 to the body portion 2604. The rectangular leg base 3002 has a lower surface 3100 and the body portion 2604 has a lower surface 3102. The vertical distance between the lower surface 3100 of the rectangular leg base 3002 and the lower surface 3102 of the body portion 2604 is substantially equal to the Z-dimension 2718.

Figure 32:
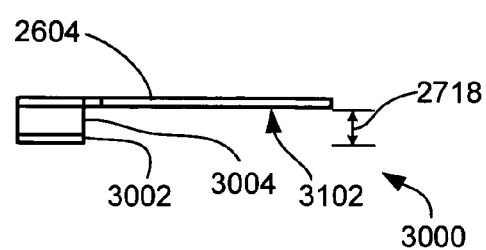
FIG. 32 is a cross-sectional view of the leg shown in FIG. 30 taken along line 32-32.

Referring now to FIG. 32 therein is shown a cross-sectional view of the leg 3000 shown in FIG. 30 taken along line 32-32. The rectangular leg base 3002 is spaced from the lower surface of the heat spreader 2602 by a distance substantially equal to the Z-dimension 2718.

Figures 33, 34, 35:
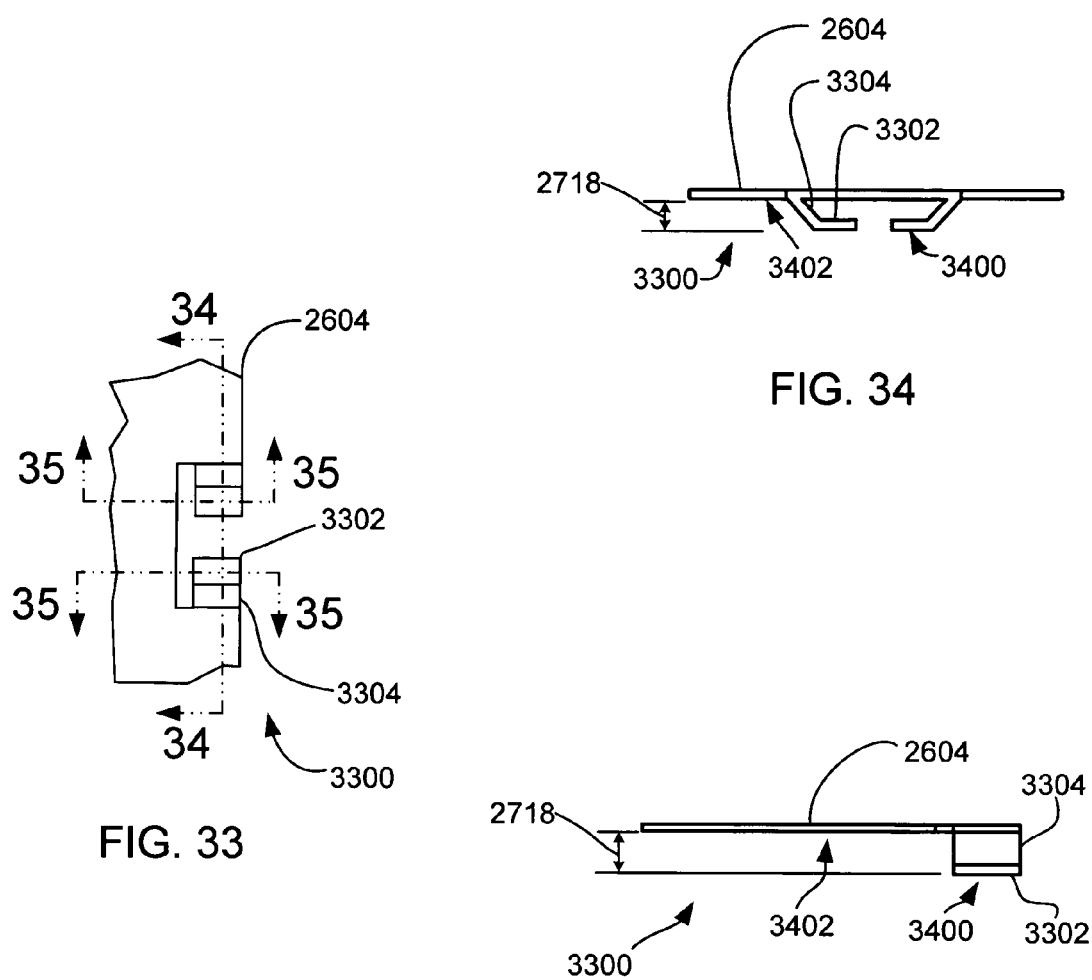
FIG. 33 is a plan view of an alternate embodiment of a leg having a split rectangular base.
FIG. 34 is a cross-sectional view of the leg shown in FIG. 33 taken along line 34-34.
FIG. 35 is a cross-sectional view of the leg shown in FIG. 33 taken along line 35-35.

Referring now to FIG. 33 therein is shown a plan view of an alternate embodiment of the leg 3000 for the electronic device 2600 shown in FIG. 26. A leg 3300 includes a split leg base 3302. Each portion of the split leg base 3302 is connected to the body portion 2604 of the heat spreader 2602 shown in FIG. 26 by a leg support 3304. The leg 3300 may be formed integrally with the body portion 2604 by any suitable manufacturing process, such as stamping, or forming.

Referring now to FIG. 34 therein is shown a cross-sectional view of the leg 3300 shown in FIG. 33 taken along line 34-34. The leg support 3304 is slanted upwardly and outwardly from the outer edges of the split leg base 3302 to the body portion 2604. The split leg base 3302 has a lower surface 3400 and the body portion 2604 has a lower surface 3402. The vertical distance between the lower surface 3400 of the split leg base 3302 and the lower surface 3402 of the body portion 2604 is substantially equal to the Z-dimension 2718.

Referring now to FIG. 35 therein is shown a cross-sectional view of the leg 3300 shown in FIG. 33 taken along line 35-35. The split leg base 3302 is spaced from the lower surface of the heat spreader 2602 by a distance substantially equal to the Z-dimension 2718.

Figure 36:
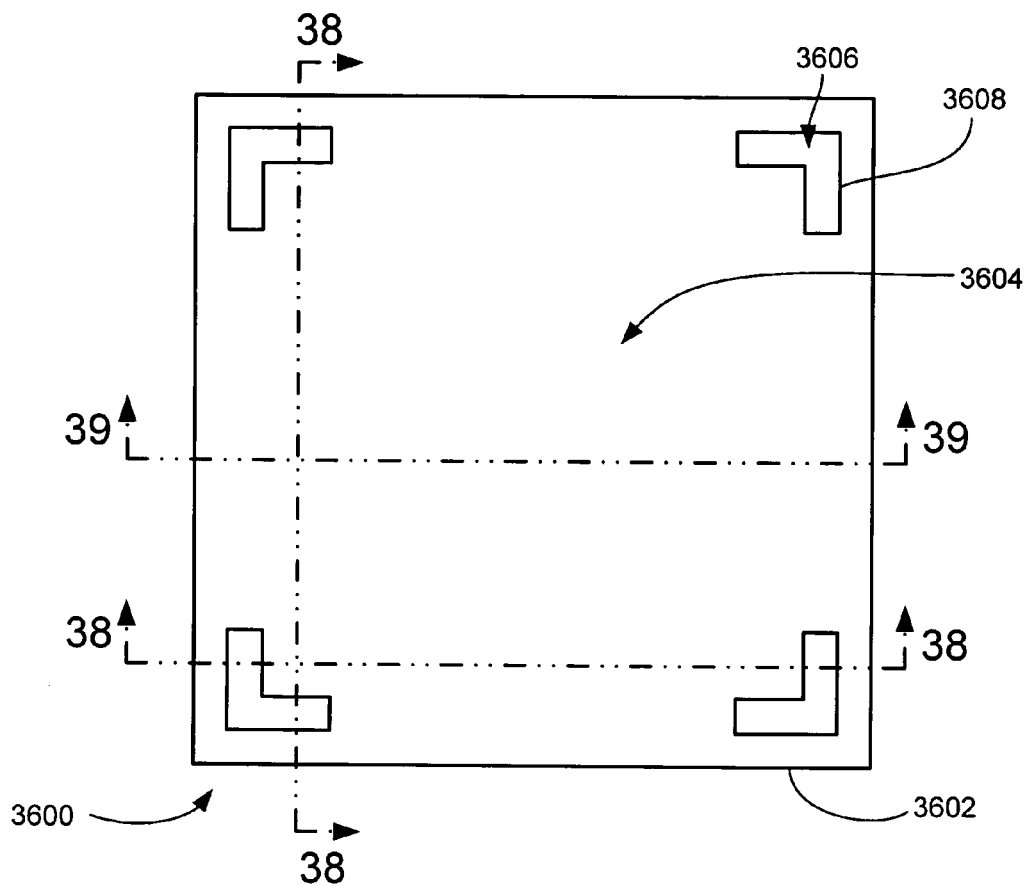
FIG. 36 is a plan view of an alternate embodiment of an electronic device manufactured in accordance with the present invention.

Referring now to FIG. 36 therein is shown a plan view of an electronic device 3600 manufactured in accordance with another embodiment of the present invention. The electronic device 3600 includes a heat spreader 3602. The heat spreader 3602 has a body portion 3604 and a number of spaces 3606 formed within the perimeter of the body portion 3604. Each of the number of spaces 3606 is substantially rectangular and is formed, such as by stamping or otherwise forming.

Each of the number of spaces 3606 is positioned interior of the perimeter of the heat spreader 3602 and near the corners of the heat spreader 3602. Within the number of spaces 3606 is a number of legs 3608.

Figure 37:
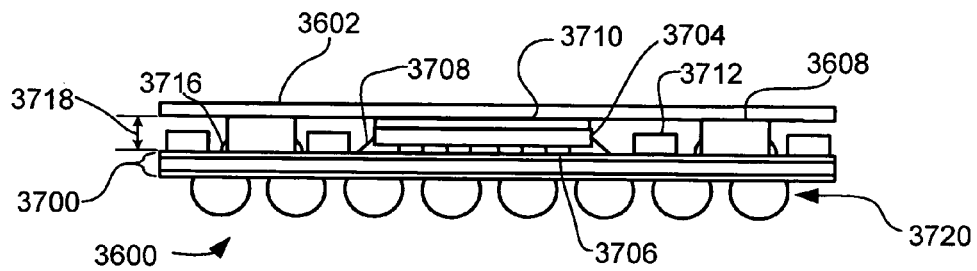
FIG. 37 is a side view of the electronic device shown in FIG. 36.

Referring now to FIG. 37 therein is shown a cross-sectional view of the electronic device 3600 shown in FIG. 36 taken along line 37-37. The electronic device 3600 has a substrate carrier 3700. A semiconductor 3704 is mounted on the upper surface of the substrate carrier 3700. The semiconductor 3704 is mounted on the substrate carrier 3700 by electrically connecting the semiconductor 3704 to the substrate carrier 3700 using a number of electrical connections 3706, such as solder balls, or solder bumps. The semiconductor 3704 also is physically attached to the substrate carrier 3700 using an adhesive layer 3708, such as an epoxy layer.

The heat spreader 3602 is attached to the upper surface of the semiconductor 3704 using a thermally conductive adhesive 3710. A number of passive components 3712, such as capacitors, also may be mounted on the substrate carrier 3700 as necessary for a particular design.

The number of legs 3608 shown in FIG. 36 is attached to the substrate carrier 3700 using a thermally conductive adhesive 3716. The space between the upper surface of the substrate carrier 3700 and the lower surface of the heat spreader 3602 is referred to herein as a Z-dimension 3718. The Z-dimension 3718 preferably is maintained constant over the surface of the substrate carrier 3700 to prevent the formation of localized hot spots in the electronic device 3600 during its operation. The length of the number of legs 3608 is substantially equal to the Z-dimension 3718.

A number of solder balls 3720 is connected to the lower surface of the substrate carrier 3700 for subsequent mounting of the electronic device 3600 to a printed circuit board (PCB), which is not shown.

Figure 38:
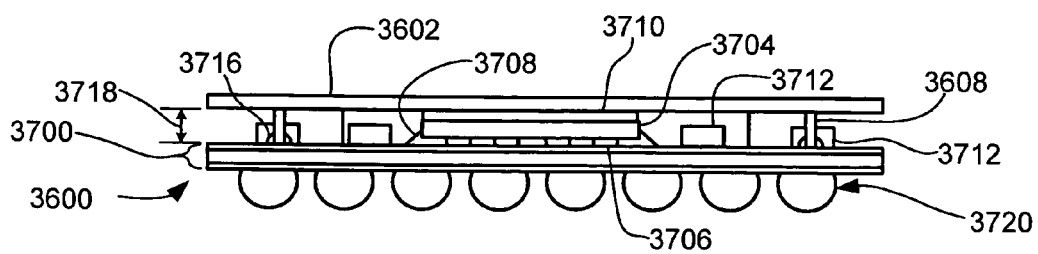
FIG. 38 is a cross-sectional view of the electronic device shown in FIG. 36 taken along line 38-38.

Referring now to FIG. 38 therein is shown a cross-sectional view of the electronic device 3600 shown in FIG. 36 taken along line 38-38. The leg 3608 is attached to the substrate carrier 3700 using the thermally conductive adhesive 3716. The leg 3608 is connected to the heat spreader 3602. The upper surface of the substrate carrier 3700 is separated from a lower surface of the heat spreader 3602 by a distance substantially equal to the Z-dimension 3718.

Figure 39:
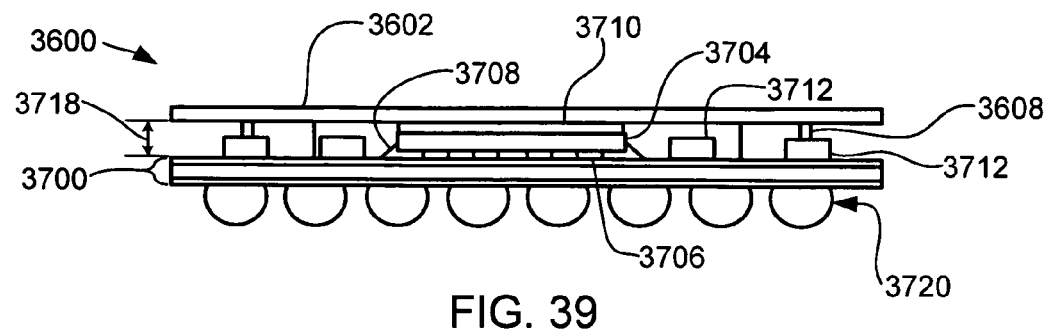
FIG. 39 is a cross-sectional view of the electronic device shown in FIG. 36 taken along line 39-39.

Referring now to FIG. 39 therein is shown a cross-sectional view of the electronic device 3600 shown in FIG. 36 taken along line 39-39. The heat spreader 3602 is positioned from the substrate carrier 3700 by the Z-dimension 3718 across substantially the entire surface of the substrate carrier 3700.

Figure 40:
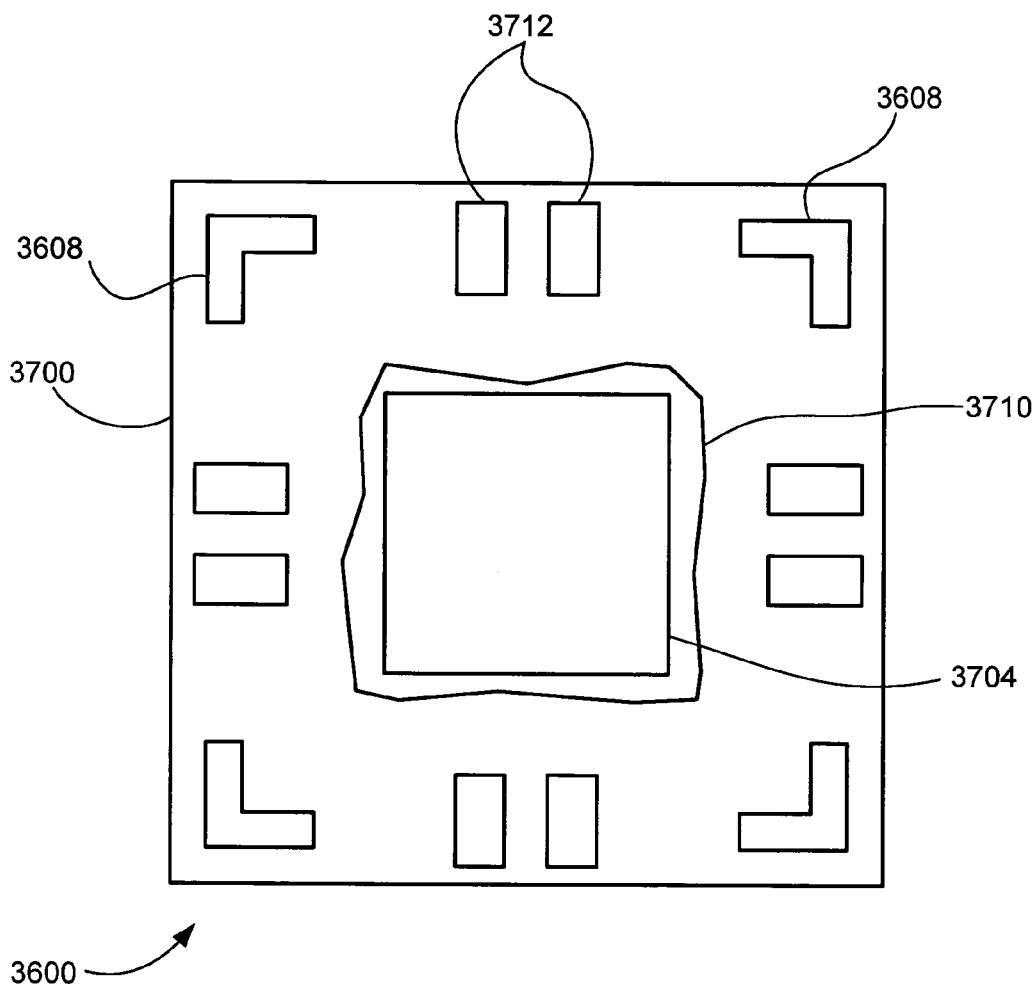
FIG. 40 is a plan view of a substrate of the electronic device shown in FIG. 36 showing the position of passive components on the substrate.

Referring now to FIG. 40 therein is shown a plan view of the substrate carrier 3700 of the electronic device 3600 shown in FIG. 36. The electronic device 3600 includes the number of passive components 3712 mounted on the substrate carrier 3700. The semiconductor 3704 is mounted on the substrate carrier 3700 in the central portion of the substrate carrier 3700 using the thermally conductive adhesive 3710. One of the number of legs 3608 is attached at each corner interior to the perimeter of the substrate carrier 3700.

Figure 41:
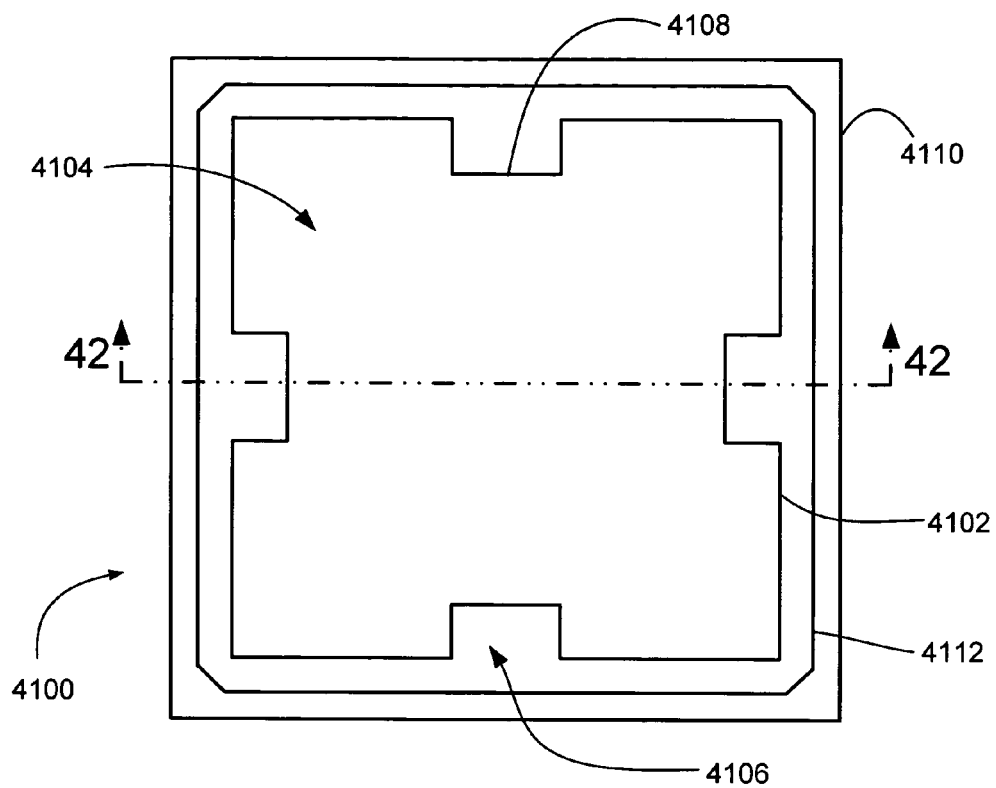
FIG. 41 is a plan view of a molded version of an electronic device manufactured in accordance with the present invention.

Referring now to FIG. 41 therein is shown a plan view of a molded version of an electronic device 4100 manufactured in accordance with another embodiment of the present invention. The electronic device 4100 includes a heat spreader 4102. The heat spreader 4102 has a body portion 4104 and a number of spaces 4106 formed within the perimeter of the body portion 4104. Each of the number of spaces 4106 is substantially rectangular and is formed, such as by stamping or otherwise forming.

Each of the number of spaces 4106 is positioned interior of the perimeter of the heat spreader 4102 and intermediate the corners of the heat spreader 4102. Within the number of spaces 4106 is a number of legs 4108.

The heat spreader 4102 substantially covers a substrate carrier 4110. A molding compound 4112, such as an epoxy compound, surrounds the heat spreader 4102 and encases the upper surface of the substrate carrier 4110.

Figure 42:
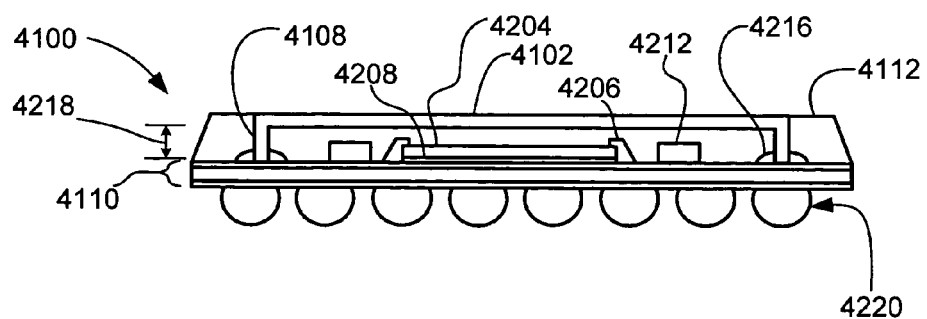
FIG. 42 is a cross-sectional view of the electronic device shown in FIG. 41 taken along line 42-42.

Referring now to FIG. 42 therein is shown a cross-sectional view of the electronic device 4100 shown in FIG. 41 taken along line 42-42. A semiconductor 4204 is mounted on the upper surface of the substrate carrier 4110. The semiconductor is attached to the substrate carrier 4110 using an adhesive layer. The semiconductor 4204 is mounted on the substrate carrier 4110 by electrically connecting the semiconductor 4204 to the substrate carrier 4110 using a number of electrical connections 4206, such as bonding wires. The semiconductor 4204 also is physically attached to the substrate carrier 4110 using an adhesive layer 4208, such as an epoxy layer. A number of passive components 4212, such as capacitors, also may be mounted on the substrate carrier 4110 as necessary for a particular design.

The heat spreader 4102 has a number of legs 4108 attached to the substrate carrier 4110 using a thermally conductive adhesive 4216 to attach the heat spreader 4102 to the substrate carrier 4110. The space between the upper surface of the substrate carrier 4110 and the lower surface of the heat spreader 4102 is referred to herein as a Z-dimension 4218. The Z-dimension 4218 preferably is maintained constant over the surface of the substrate carrier 4110 to prevent the formation of localized hot spots in the electronic device 4100 during its operation. The length of the number of legs 4108 is substantially equal to the Z-dimension 4218.

A number of solder balls 4220 is connected to the lower surface of the substrate carrier 4110 for subsequent mounting of the electronic device 4100 to a printed circuit board (PCB), which is not shown.

Figure 43:
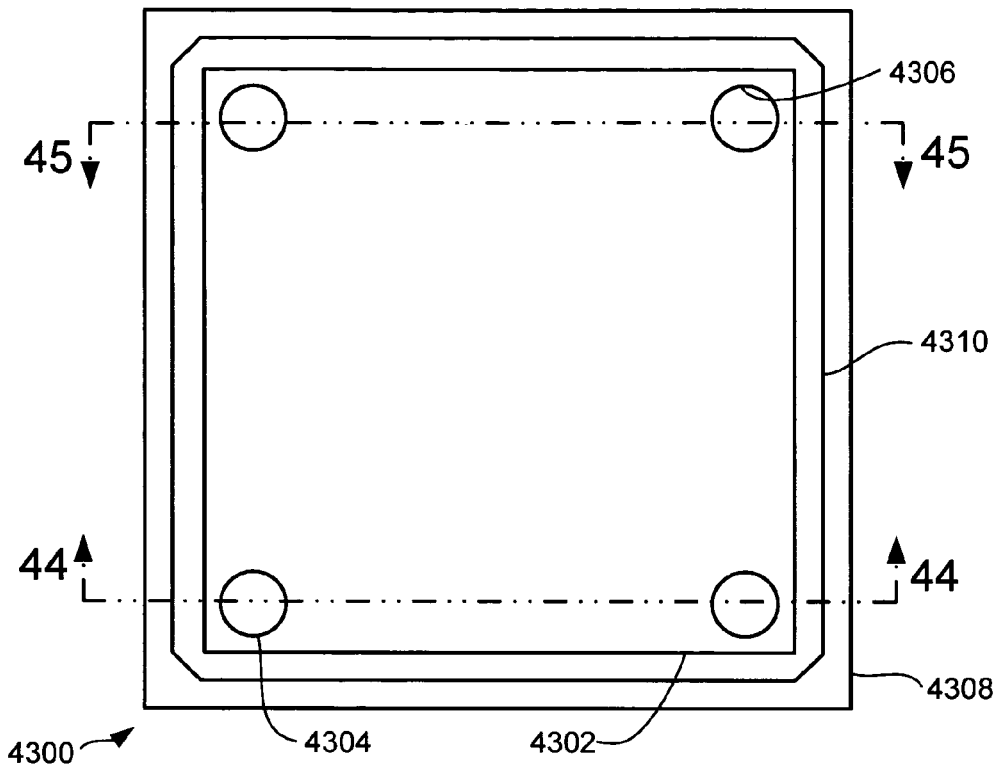
FIG. 43 is a top view of an alternate embodiment of the electronic device manufactured in accordance with the present invention having a number of ejector pin areas.

Referring now to FIG. 43 therein is shown a top view of an electronic device 4300 manufactured in accordance with an alternate embodiment of the present invention. The electronic device 4300 includes a heat spreader 4302. The heat spreader 4302 has a number of circular spaces 4304 positioned in the corners of the heat spreader 4302 and interior of the perimeter of the heat spreader 4302.

Each of the number of circular spaces 4304 is for a number of legs 4306. Each of the number of circular spaces 4304 also functions as an ejector pin area, or E-pin area. The heat spreader 4302 substantially covers a substrate carrier 4308. A molding compound 4310, such as an epoxy compound, surrounds the heat spreader 4302 and encases the upper surface of the substrate carrier 4308. Each of the number of circular spaces 4304, or E-pin areas, may be used to separate the heat spreader 4302 from the substrate carrier 4308, for example, to perform failure analysis of the electronic device 4300, by inserting a pin in the E-pin areas.

Figure 44:
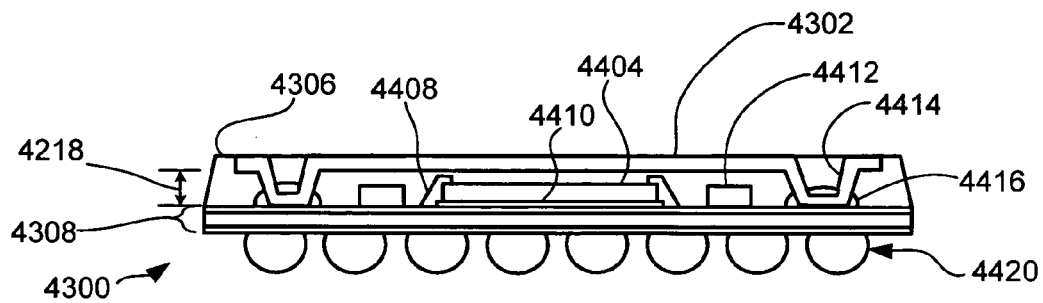
FIG. 44 is a cross-sectional view of the electronic device shown in FIG. 43 taken along line 44-44.

Referring now to FIG. 44, therein is shown a cross-sectional view of the electronic device 4300 shown in FIG. 43 taken along line 44-44. A semiconductor 4404 is mounted on the upper surface of the substrate carrier 4308. The semiconductor 4404 is mounted on the substrate carrier 4308 by electrically connecting the semiconductor 4404 to the substrate carrier 4308 using a number of electrical connections 4408, such as bonding wires. The semiconductor 4404 also is physically attached to the substrate carrier 4308 using an adhesive layer 4410, such as an epoxy layer. A number of passive components 4412, such as capacitors, also may be mounted on the substrate carrier 4308 as necessary for a particular design.

The heat spreader 4302 has a number of legs 4306 attached to the substrate carrier 4308 using a thermally conductive adhesive 4416 to attach the heat spreader 4302 to the substrate carrier 4110. The space between the upper surface of the substrate carrier 4308 and the lower surface of the heat spreader 4302 is referred to herein as a Z-dimension 4418. The Z-dimension 4418 preferably is maintained constant over the surface of the substrate carrier 4308 to prevent the formation of localized hot spots in the electronic device 4300 during its operation. The length of the number of legs 4306 is substantially equal to the Z-dimension 4418.

A number of solder balls 4420 is connected to the lower surface of the substrate carrier 4308 for subsequent mounting of the electronic device 4300 to a printed circuit board (PCB), which is not shown.

Figure 45:
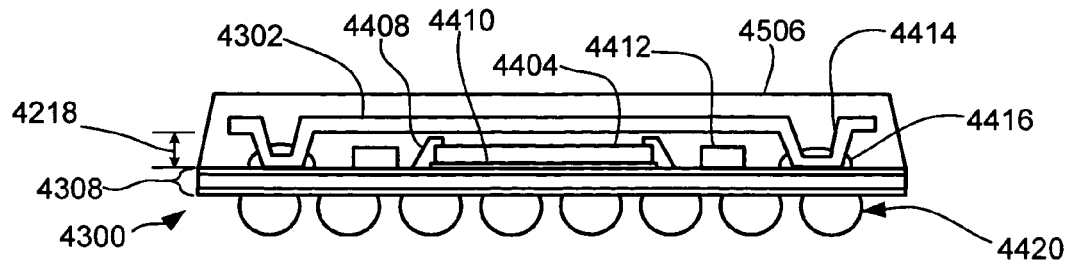
FIG. 45 is a cross-sectional view of an alternate embodiment of the electronic device shown in FIG. 43 in which the heat spreader is embedded taken along line 45-45.

Referring now to FIG. 45, therein is shown a cross-sectional view of the electronic device 4300 shown in FIG. 43 taken along line 45-45 in which the heat spreader 4302 is embedded. A molding compound 4506 encapsulates the heat spreader 4302 as well as the semiconductor 4404, the number of passive components 4412, and the number of legs 4414 for applications in which the heat spreader 4302 can be embedded in the molding compound 4506. The space between the upper surface of the substrate carrier 4308 and the lower surface of the heat spreader 4302 is still maintained substantially equivalent over the surface of the substrate carrier 4308 and substantially equal to the Z-dimension 4418 for the electronic device 4300.

It has been discovered that the present invention provides an electronic device with a heat spreader that allows more space for placement of active and passive components on a substrate carrier while maintaining the Z-dimension. The variety of structures and locations of the legs of the heat spreader provides increased flexibility in the design of electronic devices requiring heat spreaders. The variety of leg structures can be combined to accommodate a particular design of an electronic device thereby increasing design flexibility.

Thus, it has been discovered that the apparatus of the present invention furnishes important and heretofore unavailable solutions, capabilities, and functional advantages for a heat spreader. The resulting processes and configurations are straightforward, economical, uncomplicated, highly versatile, and effective, use conventional technologies, and are thus readily suited for manufacturing electronic devices requiring heat spreaders, and are fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations, which fall within the scope of the included claims. All matters set forth herein or shown in the accompanying drawings are to be interpreted in an illustrative and non-limiting sense.

The invention claimed is:

1. An electronic device comprising:
   a substrate carrier;
   a semiconductor connected to the substrate carrier;
   a heat spreader having a body portion with a perimeter, a lower surface, and a number of legs formed from the body portion of the heat spreader, interior to the perimeter of the body portion, recessed below the body portion, and attached to the substrate carrier, wherein:
   the distance between the substrate carrier and the lower surface of the body portion of the heat spreader defines a Z-dimension; and
   the Z-dimension is maintained constant over substantially the entire surface area of the body portion of the heat spreader except proximate the legs.

2. The electronic device as claimed in claim 1 wherein the number of legs comprises a leg base of at least one of circular, solid circular, square, rectangular, split, the edge of the leg, and combinations thereof.

3. The electronic device as claimed in claim 1 wherein the legs are located interior of the perimeter of the heat spreader in a position of at least one of the corners, intermediate the corners, and combinations thereof.

4. The electronic device as claimed in claim 1 further comprising at least one passive component attached to the substrate carrier.

5. The electronic device as claimed in claim 1 wherein the legs of the heat spreader are attached to the substrate carrier using a thermally conductive adhesive.

6. The electronic device as claimed in claim 1 wherein the heat spreader is attached to the semiconductor using a thermally conductive adhesive.

7. The electronic device as claimed in claim 1, further comprising a number of solder balls attached to the substrate carrier.

8. The electronic device as claimed in claim 1 wherein:
   the semiconductor is encapsulated with an encapsulant; and
   the heat spreader is partially at least one of exposed through the encapsulant, embedded in the encapsulant, and combinations thereof.

9. The electronic device as claimed in claim 8, further comprising a number of circular spaces in the heat spreader, forming ejector pin areas.

10. An electronic device comprising:
    a substrate carrier having upper and lower surfaces;
    a semiconductor attached to the upper surface of the substrate carrier with a thermally conductive adhesive;
    a heat spreader having a body portion with a perimeter, a lower surface, and a number of legs formed from the body portion of the heat spreader, interior to the perimeter of the body portion of the heat spreader, recessed below the body portion of the heat spreader, and attached to the substrate carrier with a thermally conductive adhesive;
    the body potion of the heat spreader extending over substantially the entire upper surface of the substrate carrier except proximate the legs; and
    a number of solder balls attached to the lower surface of the substrate carrier.

11. The electronic device as claimed in claim 10 wherein:
    the distance between the substrate carrier and the lower surface of the body portion of the heat spreader defines a Z-dimension; and
    the Z-dimension is maintained constant over substantially the entire surface area of the substrate carrier except proximate the legs.

12. The electronic device as claimed in claim 10 wherein the number of legs comprises a leg base of at least one of circular, solid circular, square, rectangular, split, the edge of the leg, and combinations thereof.

13. The electronic device as claimed in claim 10 wherein the legs are located interior of the perimeter of the heat spreader in a position of at least one of the corners, intermediate the corners, and combinations thereof.

14. The electronic device as claimed in claim 10 further comprising at least one passive component attached to the substrate carrier.

15. The electronic device as claimed in claim 10 wherein:
    the semiconductor is encapsulated with an encapsulant; and
    the heat spreader is partially at least one of exposed through the encapsulant, embedded in the encapsulant, and combinations thereof.

16. The electronic device as claimed in claim 15, further comprising ejector pin areas in the heat spreader.

17. A heat spreader comprising:
    a body portion having a perimeter and a lower surface;
    a number of legs formed from the body portion, interior to the perimeter of the body portion, and recessed below lower surface of the body portion;
    each of the legs comprising a leg base having a lower surface; and
    wherein the distance between the lower surface of the body portion and the lower surface of each leg base defines a Z-dimension.

18. The heat spreader as claimed in claim 17 wherein the number of legs comprises a leg base of at least one of circular, solid circular, square, rectangular, split, the edge of the leg, and combinations thereof.

19. The heat spreader as claimed in claim 17 wherein the number of legs are located interior of the perimeter of the heat spreader in a position of at least one of the corners, intermediate the corners, and combinations thereof.

* * * * *

UNITED STATES PATENT AND TRADEMARK OFFICE
CERTIFICATE OF CORRECTION

PATENT NO. : 7,327,025 B2  Page 1 of 1
APPLICATION NO. : 10/836916
DATED : February 5, 2008
INVENTOR(S) : Shim et al.

It is certified that error appears in the above-identified patent and that said Letters Patent is hereby corrected as shown below:

<u>Column 4</u>
Line 30 to 31, delete "Terms, such as "on", "above", to a direction perpendicular to the ho rizontal as just defined."

<u>Column 14</u>
Claim 10, line 4, delete "potion" and insert therefor --portion--

Signed and Sealed this

Twenty-seventh Day of May, 2008

JON W. DUDAS
*Director of the United States Patent and Trademark Office*